United States Patent
Kim et al.

(10) Patent No.: US 9,966,914 B2
(45) Date of Patent: May 8, 2018

(54) AUDIO SIGNAL PROCESSING METHOD AND ELECTRONIC DEVICE SUPPORTING THE SAME

(71) Applicant: Samsung Electronics Co. Ltd., Suwon-si, Gyeonggi-do (KR)

(72) Inventors: Jaehyun Kim, Suwon-si (KR); Misun Kim, Seoul (KR); Kyungseok Oh, Seoul (KR); Sanghoon Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1014 days.

(21) Appl. No.: 13/875,630

(22) Filed: May 2, 2013

(65) Prior Publication Data

US 2013/0294621 A1    Nov. 7, 2013

(30) Foreign Application Priority Data

May 3, 2012   (KR) ........................ 10-2012-0046835

(51) Int. Cl.
```
H03G 3/00       (2006.01)
H03G 3/30       (2006.01)
G10L 21/0324    (2013.01)
```
(52) U.S. Cl.
CPC ............ *H03G 3/00* (2013.01); *G10L 21/0324* (2013.01); *H03G 3/3005* (2013.01); *H03G 3/3089* (2013.01)

(58) Field of Classification Search
CPC ...... H03G 3/00; H03G 3/3005; H03G 3/3089; G10L 21/0324; G10L 21/034
USPC ............... 381/104, 92, 107, 56, 119; 700/94
See application file for complete search history.

(56) References Cited

U.S. PATENT DOCUMENTS

| | | | |
|---|---|---|---|
| 4,357,492 A | * | 11/1982 | Campbell ............ H03G 3/3005 381/107 |
| 5,615,270 A | | 3/1997 | Miller et al. |
| 2011/0013790 A1 | | 1/2011 | Hilpert et al. |

FOREIGN PATENT DOCUMENTS

CN     101529504 A    9/2009

OTHER PUBLICATIONS

Perez_Gonzalez et al., Automatic Gain and Fader Control for Live Mixing, 2009 IIEE Workshop on Applications of Processing to Audio and Acoustics, Oct. 18, 2009, XP031575123, IIEE, New Paltz, NY.

Mansbridge et al., Implementation and Evaluation of Autonomous Multi-Track Fader Control, Audio Engineering Society Convention Paper 8588, Apr. 26, 2012, XP040574552, Budapest, Hungary.

* cited by examiner

*Primary Examiner* — Paul S Kim
*Assistant Examiner* — Douglas Suthers
(74) *Attorney, Agent, or Firm* — Jefferson IP Law, LLP

(57) ABSTRACT

A method of processing an audio signal is provided. The method includes receiving at least one digital audio stream from at least one audio source, applying at least one gain value to each of the at least one digital audio stream by a gain adjustment unit, mixing the at least one digital audio stream to which the at least one gain value has been applied, calculating a representative gain value from the at least one gain value, calculating an extra valid headroom based on the representative gain value for correction of the mixed at least one digital audio stream, and post-processing the mixed at least one digital audio stream using the extra valid headroom.

14 Claims, 6 Drawing Sheets

⟨301⟩  ⟨303⟩

AUDIO SIGNAL PROCESSING METHOD AND ELECTRONIC DEVICE SUPPORTING THE SAME

PRIORITY

This application claims the benefit under 35 U.S.C. § 119(a) of a Korean patent application filed on May 3, 2012 in the Korean Intellectual Property Office and assigned Serial No. 10-2012-0046835, the entire disclosure of which is hereby incorporated by reference.

BACKGROUND OF THE INVENTION

1. Field of the Invention

The present invention relates to an audio signal processing of a terminal More particularly, the present invention relates to an audio signal processing method for supporting a correction processing range of an audio signal to be determined based on a gain value that has been actually set in the process of replaying at least one audio source, and a terminal supporting the same.

2. Description of the Related Art

An electronic terminal supports a certain user function and is made small so that the terminal is portable and is being used in various industries and life fields. Recently, a portable terminal for integrally supporting various user functions is being introduced. Such a portable terminal supports user functions and provides audio and video signals according to the performance of the user function through an output device. As such, the user uses the certain user function and views video signals and listens to audio signals according to the operation of the function.

In particular, if an input signal that requests a replay of an audio file such as music is generated, the portable terminal of the related art replays the audio signals of the audio file and outputs the audio signals through the audio processing unit. At this time, the replayed audio signals come to have distortions according to internal or external elements including structural and circuit characteristics of the audio replay system of the terminal. As such, appropriate processing for correcting distortions of audio signals is required. However, the portable terminal of the related art remains in a level that simply replays and outputs audio signals included in the audio file, and thus the quality of the replayed audio signals may not be good. In particular, the portable terminal of the related art corrects audio signals to be replayed within a certain number of bits, and thus the quality deterioration of the audio signals according to the above-mentioned internal or external elements necessarily occurs.

In order to address this problem, a related-art technology of post-processing audio signals in a digital scheme is provided. The post-processing technology of a digital scheme is a technology of correcting the mixed audio signals based on a predefined fixed correction range, for example, the maximum correction range that may be provided by the terminal. At this time, the post-processing technology of the related-art digital scheme corrects the mixed audio signals based on the maximum correction range, and thus when the size of the input audio signals rapidly changes or when a new audio signal is flowed in or the previously included audio signals are removed so that there is a change in the mixed audio signals, the audio signals are corrected based on the maximum correction range, and thus there may be a significant change in variation of a certain part of previous audio signals and a certain part of audio signals to which a new correction has been applied. As such, the related-art terminal may generate a signal surge in the audio signal outputting process or a signal quality deterioration due to an unnatural signal output, thereby causing inconvenience to user.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a method of collecting each gain value that is set in at least one audio source that is actually replayed and accurately providing a correction range of audio signals based thereon, and a terminal supporting the same.

Another aspect of the present invention is to improve an audio signal quality according to an output of high quality audio signals by performing more appropriate audio signal correction through providing an accurate audio signal correction range.

In accordance with an aspect of the present invention, a method of processing an audio signal is provided. The method includes receiving at least one digital audio stream from at least one audio source, applying at least one gain value to each of the at least one digital audio stream by a gain adjustment unit, mixing the at least one digital audio stream to which the at least one gain value has been applied, calculating a representative gain value from the at least one gain value, calculating an extra valid headroom based on the representative gain value for correction of the mixed at least one digital audio stream, and post-processing the mixed at least one digital audio stream using the extra valid headroom.

In accordance with another aspect of the present invention, a terminal for processing an audio signal is provided. The terminal includes a storage unit for storing at least one application program that is to use an audio replay, a controller for receiving at least one digital audio stream from at least one audio source according to activation of the at least one application program, and for applying at least one gain value to each of the received at least one digital audio stream, an audio processing unit for mixing the at least one digital audio stream to which the at least one gain value has been applied, for acquiring a representative gain value from the at least one gain value, for acquiring an extra headroom based on the acquired representative gain value, and for post-processing the mixed at least one digital audio stream based on the extra valid headroom.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
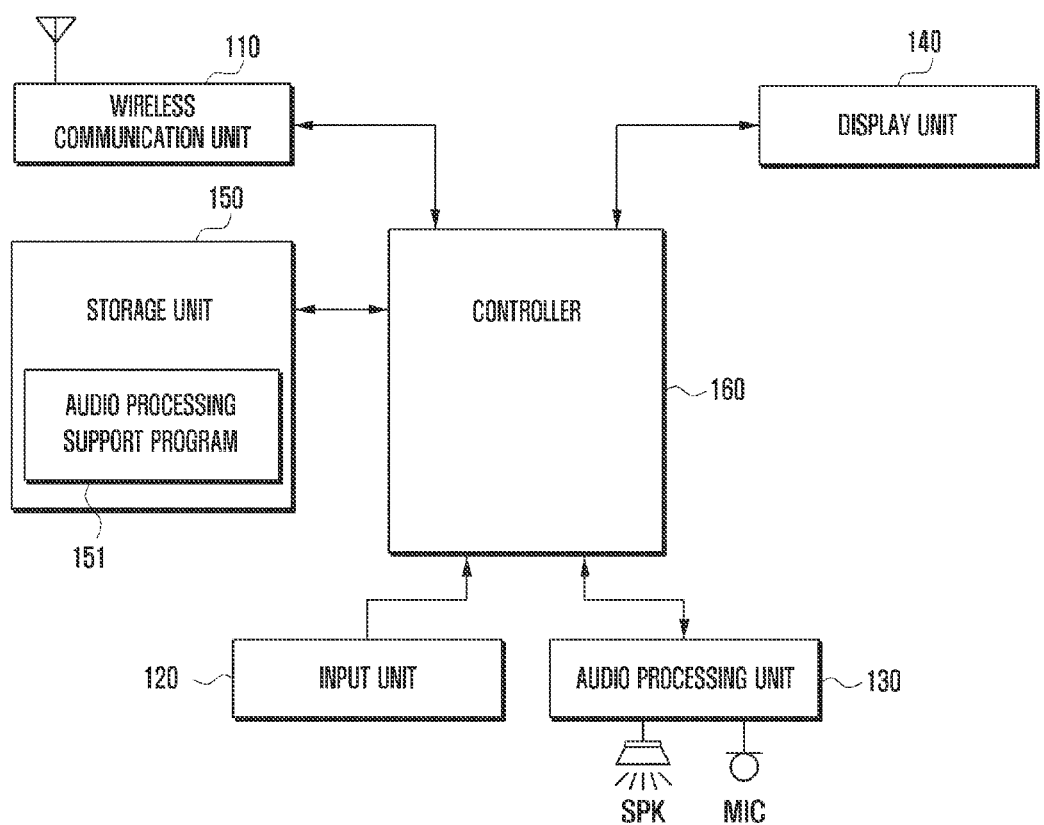
FIG. 1 is a block diagram illustrating a configuration of a terminal according to an exemplary embodiment of the present invention.

FIG. 1 is a block diagram illustrating a configuration of a terminal according to an exemplary embodiment of the present invention.

Referring to FIG. 1, a terminal 100 may include a wireless communication unit 110, an input unit 120, an audio processing unit 130, a display unit 140, storage unit 150 and a controller 160. Further, the audio processing unit 130 may be included in the controller 160 except for a hardware configuration such as a speaker SPK and a microphone MIC depending on a system designer's intention or design method. As such, FIG. 1 illustrates that the configuration of the audio processing unit 130 is independent of the controller 160, but the present invention is not limited thereto. The headroom described here refers to a post-processing margin of an audio signal to be post-processed by the digital audio post-processing unit. For example, the headroom may be defined as extra digital bits that are used to provide additional effects or correction to digital audio signals, and for example, the headroom may include the extra amount of the volume that may be additionally raised by applying the gain value. The headroom may be changed according to the system volume value of the terminal 100 or the feature of the mixer placed before the digital audio post-processing unit. The digital audio post-processing function, to which a valid headroom function is not applied, corrects output signals assuming the case where a headroom does not exist.

Further, the terminal 100 having the above-stated configuration according to an exemplary embodiment of the present invention collects each gain value applied to at least one audio signal before mixing audio signals in the process of outputting audio signals received through the wireless communication unit 110 or audio signals stored in the storage unit 150. Further, the terminal 100 calculates a representative gain value based on the collected gain values, and supports operation of the valid headroom based thereon. The valid headroom will be detailed later in detail with reference to the drawings. Further, the digital audio post-processing unit included in the audio processing unit 130 may perform correction of audio signals based on the information on the valid headroom. For example, the digital audio post-processing unit supports to evenly apply the level of the signal correction to all the signals by more accurately checking the maximum border point of the audio signals to be processed based on the valid headroom information. As such, the terminal 100 may improve the sound quality by linearly performing the post-processing correction of the output audio signals.

Further, the wireless communication unit 110 supports the communication function of the terminal 100. Such a wireless communication unit 110 may form a communication channel with a certain external server or with another terminal, and may receive audio signals from at least one of the certain external server or another terminal. The received audio signals may be transmitted to the controller 160, and may be stored in the storage unit 150 or be transmitted to the audio processing unit 130 so as to be output according to the control of the controller 160. Here, if the received audio signals are output through the audio processing unit 130, a representative gain value may be applied according to the production of a gain value before the mixing of the exemplary embodiment of the present invention, and the valid headroom may be applied based thereon. Consequently, the audio signals received by the wireless communication unit 110 may be restored to better sound quality signals compared to restored signals of the related art.

If the terminal 100 does not support the communication function, the wireless communication unit 110 may be omitted from the configuration of the terminal 100. Further, the wireless communication unit 110 may be prepared in the form of a mobile communication module to support a communication function of the terminal, in particular, the mobile communication function. The wireless communication unit 110 supports the signal transmission and reception for the performance of the mobile communication function of the terminal by forming a communication channel with the mobile communication system. For example, the wireless communication unit 110 may form at least one of a mobile communication system, a voice service channel, an image service channel and a data service channel, and may support transmission and reception of certain signals according to the service channel. To this end, the wireless communication channel 110 is not limited to a certain communication technology or scheme such as various communication modules that support each generation of the $2^{nd}$ Generation (2G), the $3^{rd}$ Generation (3G), the $4^{th}$ Generation (4G), the 5th Generation (5G), etc., communication modules that support Time Division Multiple Access (TDMA), Code Division Multiple Access (CDMA), Wideband Code Division Multiple Access (WCDMA), Frequency Division Multiple Access (FDMA), Orthogonal Frequency Division Multiple Access (OFDMA), etc., and a communication module based on a wired/wireless network, etc., and may be composed of a communication module for externally receiving audio signals.

The input unit 120 generates an input signal for controlling the terminal 100. Such an input unit 120 may be formed as a key button, a side key, a home key, etc., and may be placed in various positions such as the side of the terminal, the front or rear side, etc. Further, the input unit 120 may be prepared in various forms according to the characteristics of the terminal 100, for example, in the form of a touch map or a touch panel. The input unit 120 may generate an input signal that requests activation of an application program that is to use at least one audio replay, an input signal for setting an audio signal output of the terminal 100, for example, a gain value, an input signal for controlling an output of an audio signal, an input signal for selecting a terminal function that supports an output of a certain audio signal according to the control of user. The generated input signal may be transmitted to the controller 160 and be used as a command for supporting the function.

The display unit 140 provides various screens used for operation of the terminal 100. For example, the display unit 140 may output various screens such as a broadcast receiving screen, a file replay screen, a communication service connection screen, etc. Further, the display unit 140 may provide a screen interface for setting a gain value of an audio signal. For example, the display unit 140 may provide screen interfaces for setting the gain value for each terminal function, such as a screen interface for setting the gain value for the basic audio signal output of the broadcast receiving function, a screen interface for setting the gain value for the audio signal output at the time of replaying the music file stored in the storage unit 150, a screen interface for setting the gain value for the output of the audio signal received in the communication service connection process. The user may set the output gain value of the received broadcast audio signal while performing the broadcast receiving function, or may set the output gain value of the audio signal that is output in the process of performing other functions. The above-described screen interface may be implemented as a function window or a pop-up window, etc. for adjusting the gain value, respectively, and may be overlaid and provided on the screen according to the performance of the terminal function.

The storage unit 150 may store various programs used for operating the terminal 100, such as an operating system used for terminal operation, a broadcast receiving program for broadcast reception, a mobile communication support program for mobile communication function support, an audio file replay program for supporting a replay of an audio file, a video replay support program, etc. For example, the storage unit 150 may store at least one application program that is to use an audio replay. Further, the storage unit 150 may include an audio process support program 151 for supporting the processing of audio signals of the exemplary embodiments of the present invention.

The audio process support program 151 includes routines for supporting the processing of audio signals according to an exemplary embodiment of the present invention. For example, the audio process support program 151 may include a routine for checking validity of audio tracks to which at least one audio source is transmitted, a routine for collecting the gain value of the audio signal output that is set in the terminal function that uses the valid audio track, a routine for calculating the representative gain value among the collected one or more gain values, and a routine for calculating the valid headroom using the calculated representative gain value. Further, the audio process support program 151 may include a routine that mixes a digital audio stream transmitted from at least one audio source, and a routine that performs digital audio post-processing by applying a valid headroom to the mixed digital audio stream. The above-stated audio process support program 151 supports a digital audio post-processing function that applies the valid headroom of the exemplary embodiments of the present invention by being loaded to at least one of the controller 160 and the audio processing unit 130 at the time of activating the audio signal output function of the terminal 100.

The controller 160 supports the supply and distribution of the power and the transmission and processing of signals used for operating the terminal 100. For example, the controller 160 may control a broadcast server connection or a broadcast signal reception to support the broadcast reception function of the terminal 100, or may control to decode the received broadcast signals and separately output audio signals and video signals. Further, the controller 160 may control a power supply of a mobile communication module prepared for a mobile communication function support of the terminal 100, and may control the processing of the connection request signal of another terminal according to a user's input or the processing of the communication connection request signal received from another terminal and the camping process. At this time, the controller 160 may control an output of a received audio signal. Further, the controller 160 may control an output of the audio signal at the time of replaying an audio file including an audio file or an audio signal stored in the storage unit 150.

At least one of the audio signal output functions of the terminal 100 may be performed, and various audio sources according to the performance of a plurality of terminal functions, such as a received broadcast signal, a receive audio signal and an audio signal according to the replay of an audio file, may be transmitted to the audio processing unit 130. To this end, the controller 160 provides an audio track for transmission of an audio source according to the performance of the function at the time of performing the function of a certain terminal, and supports the transmission of the audio source to the audio processing unit 130 through the audio pass. In particular, the controller 160 may support a digital audio post-processing function through the collection of the gain value before mixture of each audio signal, calculation of the representative gain value and the calculation of the valid headroom at the time of outputting audio signals through cooperation with the audio processing unit 130.

The audio processing unit 130 supports collection of the gain value for supporting the digital audio post-processing function and the calculation and application of the valid headroom, thereby correcting a certain audio signal and transmitting the audio signal to an output device. Here, the output device of the audio signal may be the speaker SPK, an earphone connected through an ear jack, or a wirelessly connected headphone. Further, the audio processing unit 130 may further include the microphone MIC to support a mobile communication function of the terminal 100. The terminal 100 may collect audio signals using the microphone MIC, and may transmit the collected audio signals to another terminal through the wireless communication unit 110. Further, the terminal 100 may support an audio signal recording function using the microphone MIC.

Figure 2:
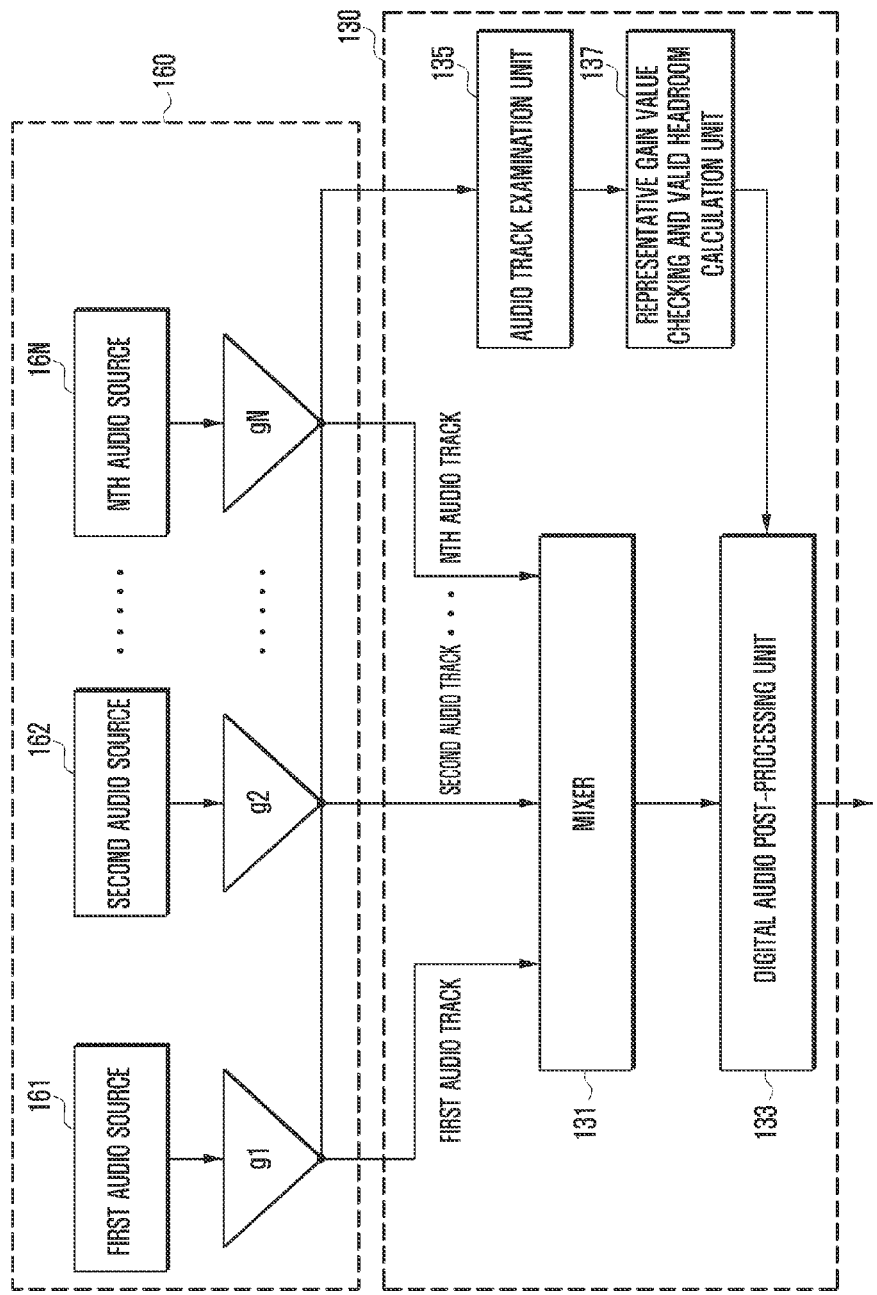
FIG. 2 illustrates in detail a configuration of a controller and an audio processing unit according to an exemplary embodiment of the present invention.

The controller 160 and the audio processing unit 130 may include a configuration as illustrated in FIG. 2 in order to support the digital audio post-processing function according to an exemplary embodiment of the present invention.

Referring to FIG. 2, first, the controller 160 may control the audio stream signal of the first audio source 161, the second audio source 162 to the Nth audio signal 16N to be output, and control gain adjustment units g1, g2, . . . , gN connected with each audio source. Each audio source may be audio information generated or received in a certain application program according to a terminal function operation activated according to schedule information or a user's input. For example, the first audio source 161 may be a broadcast audio signal output according to the performance of a broadcast reception function. Further, the second audio source 162 may be an audio source output according to a replay of an already stored audio file. Further, the Nth audio source 16N may be an audio signal received according to the performance of the mobile communication function. Further, the audio source may be various audio signals according to the performance of one function as well as the above-mentioned audio signal. For example, the user may control a replay of a plurality of audio files, and in this case, each audio source may correspond to each of the plurality of audio files. The audio stream signal provided in each audio source may be transmitted to the audio processing unit 130 through the gain adjustment units g1, g2, . . . , gN. The controller may provide a configuration of a media player and a media player service in order to replay at least one audio source, and may control the decoding of the audio source that goes through the media player service using the audio decoder. Here, the media player service may include gain adjustment units g1, g2, . . . , gN that perform the adjustment of the gain value of the audio source.

The gain adjustment units g1, g2, . . . , gN may include a first gain adjustment unit g1 connected with the first audio source 161, a second gain adjustment unit connected with the second audio source 162, and a Nth gain adjustment unit connected with the Nth audio signal 16N. The gain adjustment units g1, g2, . . . , gN transmit audio stream signals to the mixer 131 through audio tracks. Here, the gain adjustment units g1, g2, . . . , gN apply the set gain value to the audio source, and transmit the gain-adjusted audio stream signal to the mixer 131 through each audio track. Specifically, the first gain adjustment unit g1 may receive a digital audio stream from the first audio source 161, and adjust the gain value of the digital audio stream. The first gain adjustment unit g1 may be implemented as software and adjust the gain value of the digital audio stream of the first audio source 161. The second gain adjustment unit g2 adjusts the gain value of the digital audio stream received from the second audio source 162 in a similar manner as the first gain adjust unit g1. Further, the Nth gain adjustment unit gN adjusts the gain value of the digital audio stream received from the Nth audio source 16N. The gain-adjusted digital audio streams output from the first gain adjustment unit to the Nth gain adjustment unit g1, g2, . . . , gN may be transmitted to the mixer 131 of the audio processing unit 130 through each audio track.

The audio processing unit 130 includes the audio track connected to each of the gain adjustment units g1, g2, . . . , gN. For example, each audio track may include the first audio track to the Nth audio track. For example, the first audio track is allocated to the first audio source 161 and the first gain adjustment unit g1, the second audio track is allocated to the second audio source 161 and the second gain adjustment unit g2, and the Nth audio track is allocated to the Nth audio source 16N and the Nth gain adjustment unit gN.

Further, the audio processing unit 130 may include the mixer 131 connected with the audio tracks allocated to the gain adjustment units g1, g2, . . . , gN, the audio track examination unit 135 for checking audio tracks, the representative gain value checking and valid headroom calculation unit 137 connected to the audio track examination unit 135, and the digital audio post-processing unit 133 connected with the mixer and the representative gain value checking and valid headroom calculation unit 137.

The mixer 131 receives digital audio streams whose gain has been adjusted from the audio tracks allocated to the first gain adjustment unit to the Nth gain adjustment unit g1, g2, . . . , gN, and mixes the received digital audio streams. In this process, the mixer 131 adjusts the digital audio stream transmitted through each gain adjustment unit g1, g2, . . . , gN and each audio track to a common standard, and adds the streams so as to generate one digital audio stream. The generated digital audio stream may be transmitted to the digital audio post-processing unit 133. At this time, the mixer 131 may generate each digital audio stream in a scheme that adds and averages digital audio streams transmitted through the first gain adjustment unit to the Nth gain adjustment unit g1, g2, . . . , gN.

The audio track examination unit 135 detects the type and the number of audio tracks that are currently being replayed. Further, the audio track examination unit 135 checks the gain adjustment unit in an activated state among the first gain adjustment unit to the Nth gain adjustment unit g1, g2, . . . , gN, and collects the software gain value that is set in each gain adjustment unit. For example, if the first audio source 161 is activated and the digital audio stream is transmitted through the first gain adjustment unit g1 and the first audio track, the audio track examination unit 135 may recognize the state in which the first audio track has been activated. At this time, the audio track examination unit 135 collects the gain value of the first gain adjustment unit g1 connected with the first audio track. In such a manner, the audio track examination unit 135 examines an activated, valid audio track and gain adjustment units g1, g2, . . . , gN connected with the audio track. The gain values collected from the gain adjustment units currently in an activated state may be transmitted to the representative gain value checking and valid headroom calculation unit 137.

The audio track examination unit 135 collects the gain values of the gain adjustment units g1, g2, . . . , gN in real time or periodically according to the setting, or may collect the gain values of the gain adjustment units g1, g2, . . . , gN if at least one of the application programs that requests a replay of a new audio source and a new audio replay is activated. Further, the audio track examination unit 135 may collect gain values of the gain adjustment units if the replay of the previous audio source being replayed is terminated or the application program is terminated.

The representative gain value checking and valid headroom calculation unit 137 calculates the representative gain value among the gain values of the gain adjustment units in the activated state, which are transmitted by the audio track examination unit 135. For example, in a case where the gain value that is set in the first gain adjustment unit g1 is 0.8 and the gain value that is set in the second gain adjustment unit g2 is 0.6, the representative gain value checking and valid headroom adjustment unit 137 may calculate the average 0.7 as the representative gain value or the maximum 0.8 as the representative gain value. The representative gain value checking and valid headroom calculation unit 137 calculates the valid headroom value if the representative gain value is produced. The valid headroom value may be a result of 1 minus the representative gain value. For example, if the representative gain value is 0.7, the valid headroom value may be 0.3. The representative gain value checking and valid headroom calculation unit 137 may transmit the produced valid headroom value to the digital audio post-processing unit 133.

The configuration of the above-stated audio tracks, the mixer 131, the audio track examination unit 135, and the representative gain value checking and valid headroom calculation unit 137 may be divided by the audio framework.

The digital audio post-processing unit 133 receives one digital audio stream mixed from the mixer 131, and receives a valid headroom value from the representative gain value checking and valid headroom calculation unit 137. The digital audio post-processing unit 133 checks the correction range that may improve the sound quality and volume of audio signals to be finally output using the valid headroom value. Further, the digital audio post-processing unit 133 may apply the signal processing algorithm depending on the predefined method, such as gradually correcting the sound quality of the output signal or correcting the volume depending on the size of the valid headroom. For example, the digital audio post-processing unit 133 may perform correction of the transmitted digital audio stream, and, at the same time, may stably control the signal change not to exceed the maximum correction range while linearly operating the signal change using the valid headroom value. Thereafter, the digital audio post-processing unit 133 may support the corrected audio signal to be output to an audio output hardware device such as a speaker and an earphone through a kernel, etc.

Further, it was described above that the digital audio post-processing unit 133 performs the audio signal output function, but the audio processing unit 130 may further include a configuration of an audio signal output unit that transmits the signals, which are transmitted from the digital audio post-processing unit, to a hardware device such as a speaker or an earphone through a kernel. Further, the correction according to the application of the valid headroom will be described in detail with reference to FIG. 3.

Figure 3:
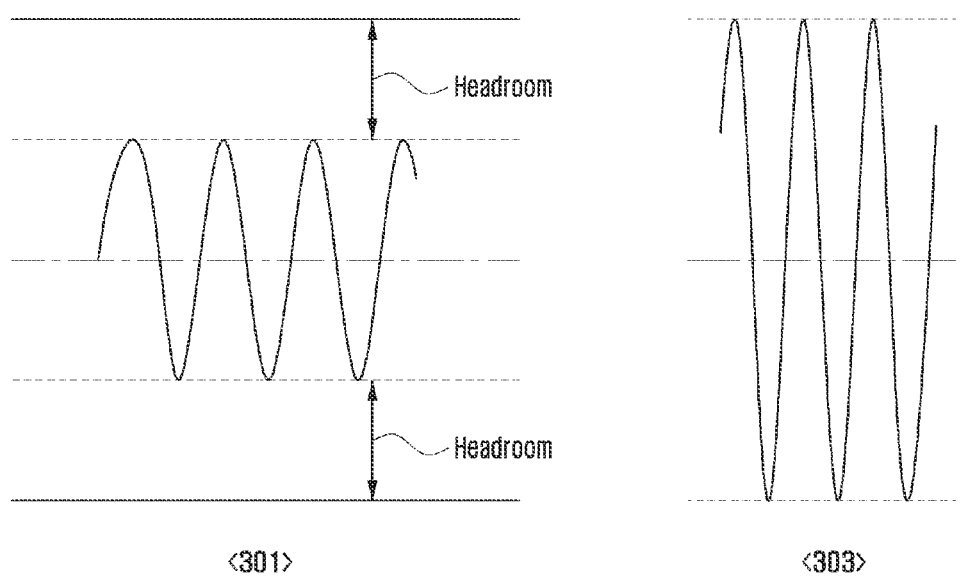
FIG. 3 illustrates a state where a valid headroom is applied and a state where a valid headroom is not applied according to an exemplary embodiment of the present invention.

FIG. 3 illustrates a state where a valid headroom is applied and a state where a valid headroom is not applied according to an exemplary embodiment of the present invention.

Referring to FIG. 3, the thick solid line of graph 301 corresponds to the maximum correction range of the audio signal that may be provided by the terminal 100. For example, if the amplitude of the input digital audio stream is beyond the thick solid line, the signals of the part outside the solid line may be clipped/saturated so as to be removed. For example, if the digital audio stream exceeds the maximum correction range, the audio signals corresponding to the amplitude greater than a certain size beyond the maximum correction range are blocked. Consequently, a phenomenon such as a situation where a certain audio signal is removed and is not heard may occur. Further, as illustrated, in a case where the digital audio stream corresponding to the dotted line range is transmitted from the mixer 131, the digital audio post-processing unit 133 may correct and extend the digital audio stream by as much as the headroom size. At this time, the digital audio post-processing unit 133 knows the value of the maximum correction range provided by the hardware feature of the terminal 100 and predicts the size of the valid headroom calculated through checking the software gain value of the currently replayed audio source, and thus it is possible to correct the digital audio stream not to exceed the maximum correction range while linearly correcting the stream according to the user's request or setting. In particular, the digital audio post-processing unit 133 may linearly perform the signal correction based on the valid headroom information in the process of irregularly changing the size of the input digital audio stream, and thus the digital audio post-processing unit 133 supports performance of an output of a more improved audio signal.

Further, graph 303 shows the state where the headroom is not applied, and shows the digital audio post-processing unit 133 that performs interval correction based on the fixed correction range, for example, the maximum correction range, when the valid headroom is not applied. If a separate valid headroom is not applied, the digital audio post-processing unit 133 determines a certain fixed correction ranged that may be provided by the terminal 100, for example, the maximum correction range, as a correction range within which the audio signal correction may be performed, and the digital audio post-processing unit 133 performs the audio signal correction based on the fixed maximum correction range.

As described above, the terminal 100 may predict the correction range of the digital audio stream transmitted from the mixer 131 by calculating the valid headroom information based on the actually applied gain value of the gain adjustment units g1, g2, . . . , gN connected to the activated audio tracks, and thus the terminal 100 supports linear performance of more various and adaptive audio corrections. The terminal 100 may check the gain values collected by calculating the actually applicable gain values in real time or periodically, and may perform audio correction that applies the changed gain value. In particular, the terminal 100 may sense the change of each gain value according to activation of a new audio track by activation of a certain application program or deactivation of a previous audio track by termination of a certain application program, and may then apply the changed valid headroom value. In this process, if the application program that is to use the audio replay is newly activated or deactivated, the terminal 100 may perform the calculation of the valid headroom, and may apply the changed headroom. Further, the terminal 100 may support application of the change of the valid headroom while calculating and applying the valid headroom according to preset schedule information.

Figure 4:
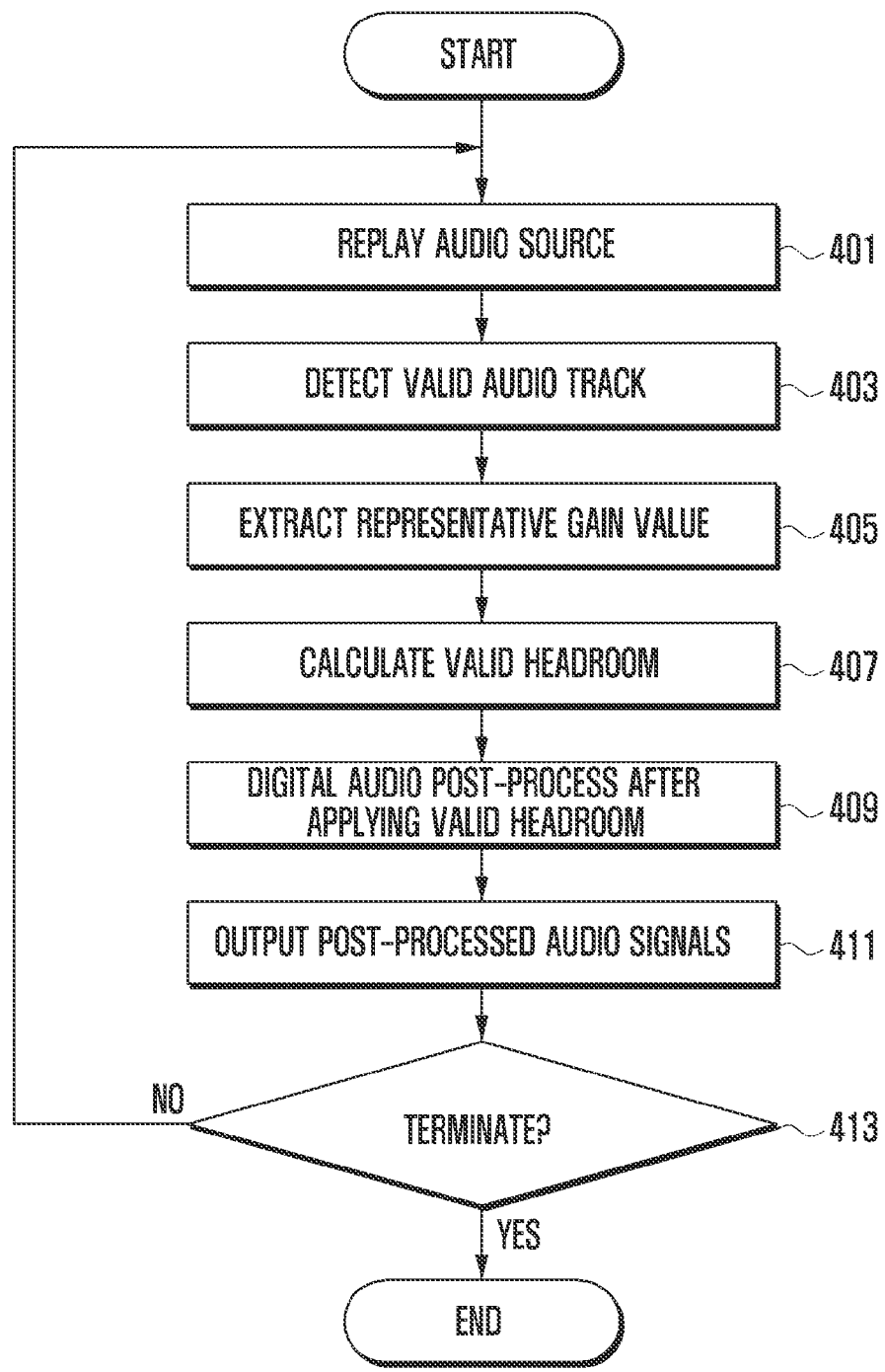
FIG. 4 is a flowchart illustrating a method of processing audio signals according to an exemplary embodiment of the present invention.

FIG. 4 is a flowchart illustrating a method of processing audio signals according to an exemplary embodiment of the present invention.

Referring to FIG. 4, the audio signal processing method may first perform a replay of an audio source in step 401. To this end, the controller 160 of the terminal 100 may activate at least one application program that is to use the audio replay according to an input signal input from the input unit 120 or preset schedule information. Here, the controller 160 may support a replay of a plurality of audio sources according to a plurality of activated application programs if the terminal 100 supports multi-tasking. The audio source is decoded to replay the audio source, and the decoded digital audio stream may be output as certain audio tracks after going through the gain adjustment units included in the media player service. For example, the controller 160 may allocate the audio track to output the audio source at the time of replaying the audio source, and the audio source may be transmitted to the allocated audio track after the gain is adjusted in the gain adjustment unit included in the media player service. Here, the controller 160 may control to check the gain value that is preset in the audio source, and apply the set gain value to be applied to the gain adjustment unit.

If the certain audio track is activated by the performance of the audio source replay, the audio track examination unit 135 checks the number of the activated audio track and the attributes of each audio track, and checks the gain value that is set in the gain adjustment unit connected to the audio track in step 403. Further, the audio track examination unit 135 transmits at least one collected gain value to the gain value checking and valid headroom calculation unit 137.

The representative gain value checking and valid headroom calculation unit 137 calculates the representative gain value of the gain values in step 405 and calculates the valid headroom based on the calculated representative gain value in step 407. Here, the representative gain value may be determined as the average or the largest value of a plurality of gain values as described above. Further, if one audio source is replayed and thereby only one gain value is collected, the representative gain value may be determined as the collected one gain value. The valid headroom value may be calculated as shown in Equation 1 below.

$$\text{Valid headroom} = 1 - \text{representative gain value} \quad \text{Equation 1}$$

The representative gain value checking and valid headroom calculation unit 137 transmits the valid headroom value to the digital audio post-processing unit 133.

The digital audio post-processing unit 133 may perform correction of the digital audio stream using the received valid headroom value in step 409. The digital audio stream is received from the mixer 131. If the audio source is replayed and is output through the audio track at step 401, the mixer 131 receives the output and generates digital stream audio signals according to the predefined standard. In particular, if a plurality of audio sources is transmitted, the mixer 131 adjusts each audio source according to the defined standard, and generates one digital stream audio signal based thereon.

Next, the digital audio post-processing unit 133 may output post-processed audio signals through the speaker SPK or another output device such as an earphone or a headset in step 411.

Further, the terminal 100 may check whether an input signal for termination of a replay of an audio source of the terminal 100 is generated in step 413, and may return to step 401 and re-perform the following process if the input signal is not generated. In particular, the terminal 100 may continually perform steps 409 and 411, and if a new audio source replay occurs or a previous audio source replay is terminated, the terminal 100 may control re-performance of steps 403 to 407.

Figure 5:
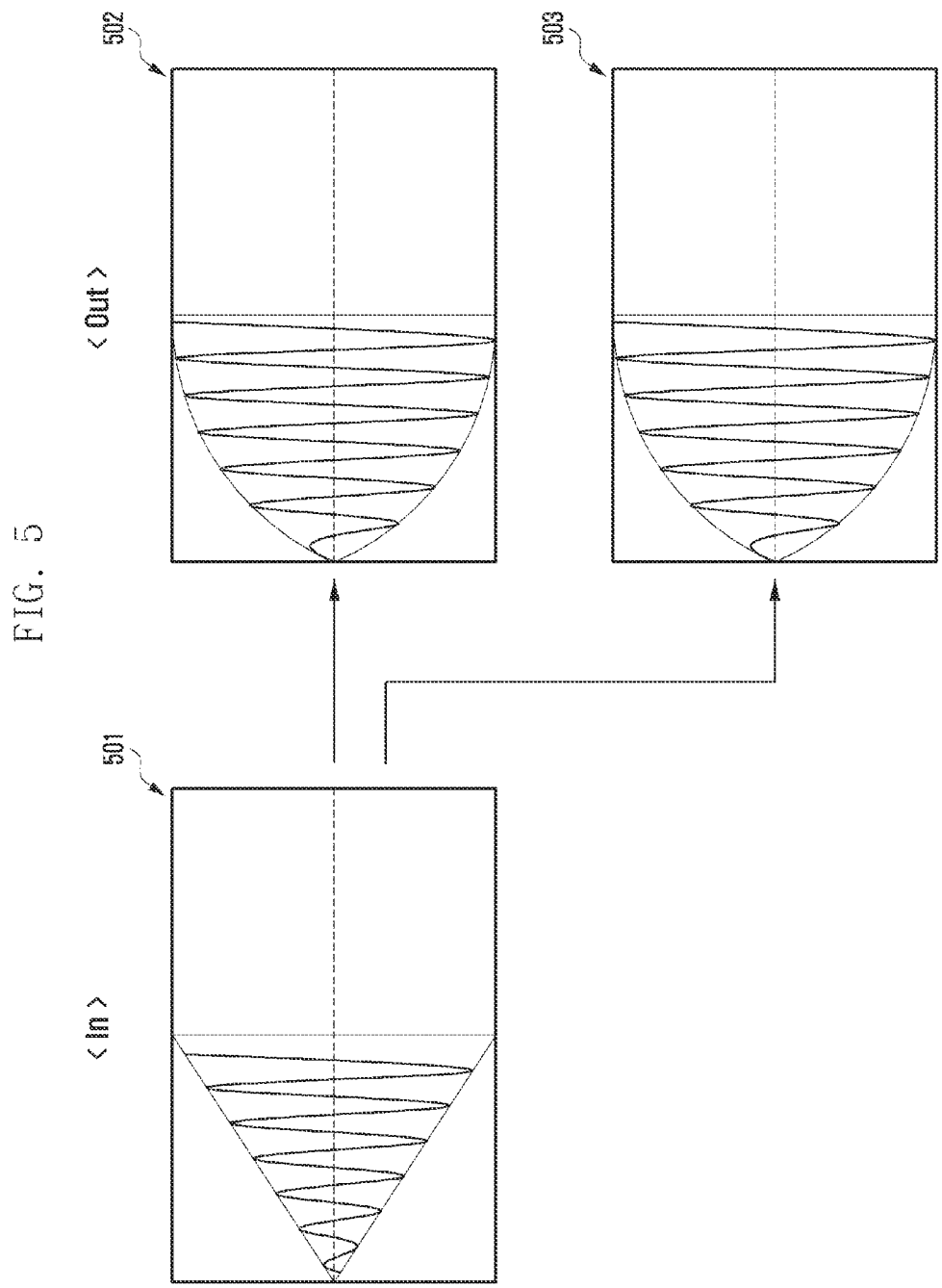
FIGS. 5 and 6 illustrate output signal forms according to an input of a test signal according to an exemplary embodiment of the present invention and the related art.
Figure 6:
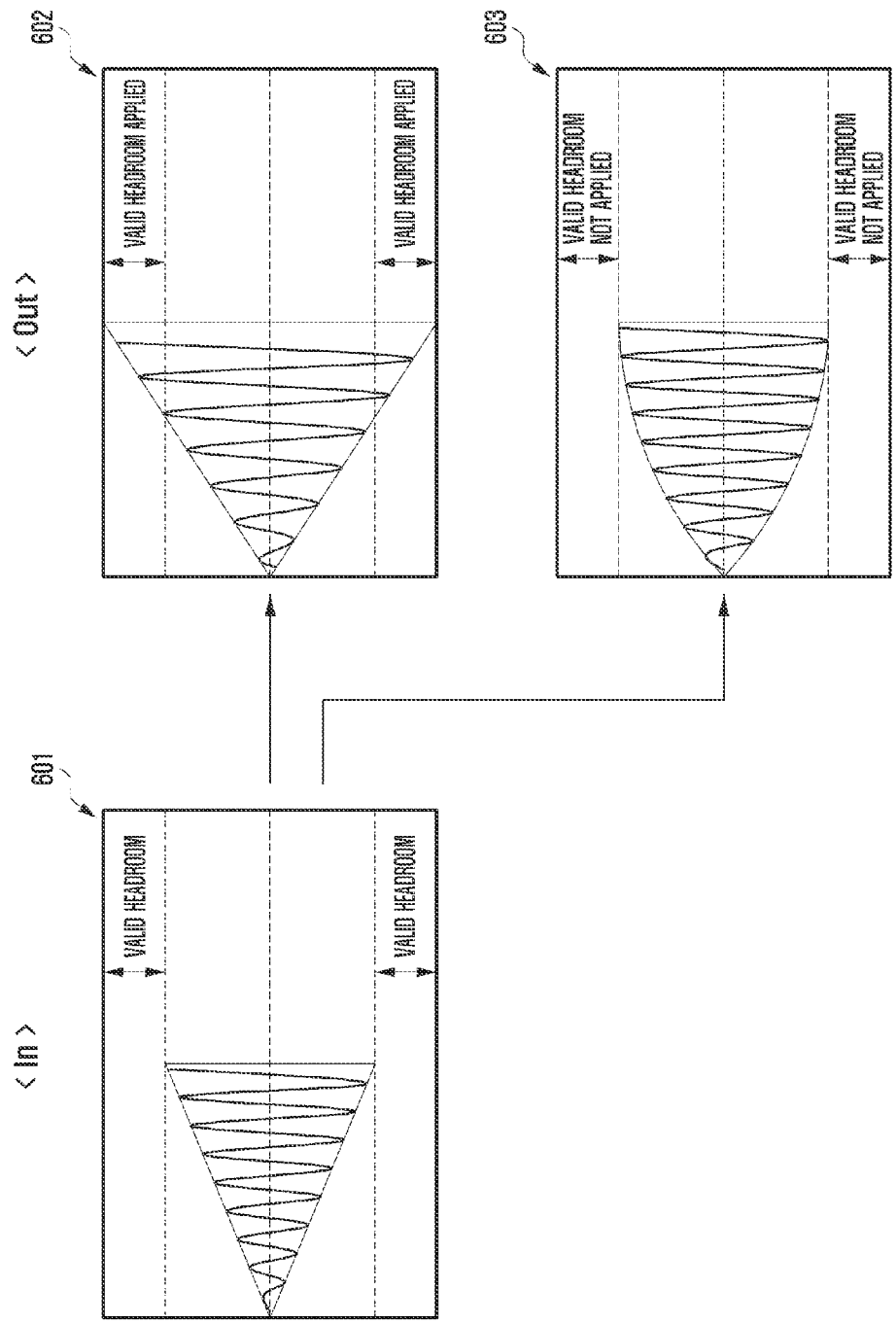

FIGS. 5 and 6 illustrate output signal forms according to an input of a test signal according to an exemplary embodiment of the present invention and the related art.

Graph 501 of FIG. 5 shows a test signal in which the terminal 100 has the maximum signal range where the clipping of the audio signals does not occur. In a case where the audio signals as in graph 501 are provided to the digital audio post-processing unit 133 that performs the role of the volume increase without clipping by applying the valid headroom of the exemplary embodiment of the present invention, the audio signals are output as shown in graph 502. Further, the digital audio post-processing unit, which performs the role of increasing the volume without clipping where the valid headroom is not applied, shows the result as in graph 503 in a form similar to that of graph 502 for test signals as in graph 501. For example, in a case where the test signal has the maximum signal range that is set not to generate clipping in the hardware of the terminal 100, there is no valid headroom that is available in the signal correction, and thus similar performance results are shown for both the case in which the valid headroom is applied and the case in which the valid headroom is not applied.

Further, graph 601 of FIG. 6 shows test signals having the valid headroom in which the clipping of the audio signals does not occur, the signal range is not the maximum and the gain value is smaller than 1. In a case where the audio signals shown in graph 601 are provided to the digital audio post-processing unit 133 that performs the role of the volume increase without clipping by applying the valid headroom of the exemplary embodiment of the present invention, the linear result is output along with the input signals using the valid headroom as shown in graph 602. Here, it is assumed that the range that requests the correction of audio signals is the maximum signal range that may be provided by the terminal 100.

Further, the digital audio post-processing unit, which performs the role of the volume increase without clipping where the valid headroom is not applied, outputs the shape of the group that does not use the valid headroom as in graph 603 for test signals as in graph 601. For example, the digital audio post-processing unit, to which the valid headroom is not applied, cannot collect information on the maximum correction value, and thus the fixed certain correction standard may be applied, and as such, even if there is a valid headroom range that may extend the audio signals, the valid headroom may not be applied and the audio signals may be corrected according to the determined correction standard. Consequently, the digital audio post-processing unit, which does not apply the valid headroom, performs only the non-linear correction according to the fixed correction standard for the input signals. If only such a non-linear correction is performed, there may be relatively a large signal distortion compared to the case where the valid headroom of the exemplary embodiment of the present invention is applied, and such a distortion may cause significant sound quality deterioration. On the other hand, the digital audio post-processing function, to which the valid headroom of the exemplary embodiments of the present invention is applied, supports linear signal correction by as many as the valid headroom, the valid headroom information may be checked before mixture and may be applied to the mixed signals, and thus linear signal correction may be provided and the signal correction may be stably performed without clipping or saturation.

In addition, in a case where an effect larger than the size of the valid headroom is applied for an input signal, for example, in a case where there is a request such as an amplitude extension for voice extension or a frequency addition for the support of a certain pitch, the digital audio post-processing unit 133, which applies the valid headroom of the exemplary embodiment of the present invention, may perform the linear correction by as much as the valid headroom, and the non-linear correction may be performed so that the clipping and saturation do not occur in the maximum correction range. For example, in a case where a certain input signal having the size of 0.6 is input, the upper part and the lower part of the valid headroom have the respective size of 0.2, and an input signal, which requires the correction by as much as 1.2 for the input signal, is generated, the digital audio post-processing unit 133 may perform linear signal correction for the valid headroom size by as much as 0.2 respectively for the input signal of 0.6, and when the range of 1.0, which is the maximum correction range, is reached, the correction of the following 0.2 may be performed as non-linear correction. Further, the digital audio post-processing unit 133, to which the valid headroom is not applied, performs only the non-linear correction without applying the valid headroom. In a case where the above-mentioned signals are compared, the post-processed audio signals, to which the valid headroom is not applied, may have more severe distortions in the non-linear portion compared to the post-processed audio signals based on the valid headroom of the exemplary embodiment of the present invention, and the size of the correction may be substantially shown differently.

Likewise, the audio signal processing method of the exemplary embodiment of the present invention may provide a more valid correction range by checking the gain value of the gain adjustment units connected with the actually activated audio track and applying the valid headroom based thereon without using the fixed correction range. In this process, the exemplary embodiment of the present invention may not need to separately analyze the digital audio signals by simply predicting the valid headroom value through only the audio track examination and may minimize the surge or unnaturalness of signals by providing appropriate signal correction. For example, the exemplary embodiment of the present invention may support an effective and efficient sound quality and volume improvement on the audio output path by utilizing the valid audio track information within the audio framework including the audio track and the mixing in the process of replaying digital audio signals.

Further, the terminal 100 may further include various additional modules depending on the provided type. For example, the terminal 100 may further includes a local area communication module for a local area communication, an interface for data transmission and reception by a wireless or wired communication scheme of the terminal 100, an Internet communication module for performing an Internet function by communication with the Internet network, and a digital broadcast module for receiving a digital broadcast and performing a replay function. Not all such components may be listed here because the components may be modified in various manners according to the convergence trend of digital devices, but components of the same level as that of the above-mentioned components may be additionally included in the device. Further, some components of the terminal 100 described herein may be excluded from the above-mentioned configuration or may be substituted by other components, which will be easily understood by one of ordinary skill in the art.

Further, the terminal 100 according to an exemplary embodiment of the present invention may include all information communication devices, multimedia devices and application devices thereof, such as a Portable Multimedia Player (PMP), a digital broadcast player, a Personal Digital Assistant (PDA), a music player (e.g., a digital audio player player), a portable game console, a smart phone, a notebook computer, a handheld Personal Computer (PC) as well as all mobile communication terminals operated according to communication protocols corresponding to various communication systems.

As described above, according to a method of processing audio signals and a terminal supporting the same of the exemplary embodiment of the present invention, more appropriate signal post-processing is support by accurately providing an audio signal correction range applied to a digital post-processing process of audio signals, and thereby audio signal quality may be improved.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method of processing an audio signal, the method comprising:
   receiving a plurality of digital audio streams from a plurality of audio sources;
   applying at least one gain value to each of the plurality of digital audio streams by gain adjustment units, the at least one gain value being specific to the each of the plurality of digital audio streams;
   mixing the plurality of digital audio streams to which the at least one gain value has been applied to obtain a mixed digital audio stream;
   calculating a representative gain value for the mixed digital audio stream from the at least one gain value;
   calculating a valid headroom by deducting the representative gain value from a maximum gain value;
   identifying a pre-defined maximum correction range for adjusting volume of the mixed digital audio stream; and
   linearly correcting a volume of the mixed digital audio stream within the maximum correction range using the valid headroom.

2. The method of claim 1, further comprising:
   collecting the at least one gain value.

3. The method of claim 2, wherein at least one of the collecting, the calculating of the representative gain value, and the calculating of the valid headroom is performed in real time or according to a preset period.

4. The method of claim 2, wherein at least one of the collecting, the calculating of the representative gain value, and the calculating of the valid headroom is performed in response to at least one of a replay of a new audio source and activation of an application program that is to use the new audio replay.

5. The method of claim 2, wherein at least one of the collecting, the calculating of the representative gain value, and the calculating of the valid headroom is performed in response to a replay of an audio source being replayed is terminated or an application is terminated.

6. The method of claim 1, wherein the calculating of the representative gain value includes any one of:
   acquiring an average value of the at least one gain value as the representative gain value; and
   acquiring a largest value among the at least one gain value as the representative gain value.

7. The method of claim 1, further comprising:
   outputting the mixed digital audio stream corrected by an application of the valid headroom.

8. A terminal for processing an audio signal, the terminal comprising:
   a memory configured to store at least one application program that is to use an audio replay;
   a controller configured to receive a plurality of digital audio streams from a plurality of audio sources according to activation of the at least one application program, and for applying at least one gain value to each of the received plurality of digital audio streams, the at least one gain value being specific to the each of the plurality of digital audio streams; and an audio processing unit, executed by the controller, configured to:
mix the plurality of digital audio streams to which the at least one gain value has been applied to obtain a mixed digital audio stream,
calculate a representative gain value for the mixed digital audio stream from the at least one gain value,
calculate a valid headroom by deducting the representative gain value from a maximum gain value,
identify a pre-defined maximum correction range for adjusting volume of the mixed digital audio stream, and
linearly correct a volume of the mixed digital audio stream within the maximum correction range using the valid headroom.

9. The terminal of claim 8, wherein the audio processing unit comprises:
a representative gain value checking and valid headroom calculation unit, executed by the controller, configured to calculate the representative gain value, and calculate the valid headroom based on the calculated representative gain value; and
a digital audio post-processing unit, executed by the controller, configured to post-process the mixed digital audio stream using the valid headroom.

10. The terminal of claim 9, wherein the representative gain value checking and valid headroom calculation unit is further configured to calculate an average value of the at least one gain value as the representative gain value, or calculate a largest value among the collected at least one gain value as the representative gain value.

11. The terminal of claim 9, wherein the audio processing unit further comprises an audio track examination unit configured to perform collection of the at least one gain value in real time or according to a preset period.

12. The terminal of claim 11, wherein the audio track examination unit is further configured to collect the at least one gain value if at least one of a replay of a new audio source and activation of an application program that is to use the new audio replay is performed.

13. The terminal of claim 11, wherein the audio track examination unit is further configured to collect the at least one gain value if an audio source being replayed is terminated or the application program is terminated.

14. The terminal of claim 9,
wherein the audio processing unit further comprises an audio signal output unit, executed by the controller, configured to output the corrected mixed digital audio stream by applying the valid headroom, and
wherein the terminal further comprises an output device configured to output the corrected mixed digital audio stream.

* * * * *